United States Patent [19]
Roman

[11] Patent Number: 5,892,363
[45] Date of Patent: Apr. 6, 1999

[54] ELECTROSTATIC FIELD MEASURING DEVICE BASED ON PROPERTIES OF FLOATING ELECTRODES FOR DETECTING WHETHER LIGHTNING IS IMMINENT

[76] Inventor: Francisco Jose Roman, Bäktargatan 74A-111, 75422 Uppsala, Sweden

[21] Appl. No.: 714,332

[22] Filed: Sep. 18, 1996

[51] Int. Cl.[6] .................................................. G01R 27/26
[52] U.S. Cl. ......................... 324/452; 340/601; 324/457; 324/72
[58] Field of Search .................................. 324/452, 457, 324/72, 72.5; 340/601

[56] References Cited

U.S. PATENT DOCUMENTS

| | | | |
|---|---|---|---|
| 1,697,177 | 1/1929 | Fortescue . | |
| 1,731,873 | 10/1929 | Smith . | |
| 2,140,395 | 12/1938 | Trencham et al. | 175/183 |
| 2,412,191 | 12/1946 | Zottu | 171/95 |
| 2,948,849 | 8/1960 | Foster | 324/54 |
| 4,823,115 | 4/1989 | McCallie | 324/72 |
| 4,935,657 | 6/1990 | Lherm et al. | 310/309 |
| 5,241,276 | 8/1993 | Tanalea | 324/452 |
| 5,256,974 | 10/1993 | Padden | 324/458 |
| 5,293,113 | 3/1994 | Beha et al. | 324/72.5 |
| 5,300,889 | 4/1994 | Bakhoum | 324/457 |
| 5,315,254 | 5/1994 | Wang | 324/452 |

OTHER PUBLICATIONS

Francisco Romám Campos, *The Influence of a Floating Electrode on the Breakdown Voltage of a Complex Gap*, Román, F.: UURIE 269–95 1, Institute of High Voltage Research, Uppsala University, 1995.

Francisco Roán Campos, Vernon, Cooray, and Viktor Scuka, Corona From Floating Electrodes, Journal of Electrostatics: Fundamentals, Applications and Hazards, Institute of High Voltage Research, Uppsala University, Husbyborg, S–752 28 Uppsala, Sweden, Oct. 1995.

Francisco Román Campos, Erik Lötberg, Rolf Högberg, and Vikor Scuka, *Electrical Characteristics of Insulated Metallic Bodies in a Lightning Breakdown Field*, Institute of High Voltage Research, Uppsala University, Sweden, 22nd International Conference on Lightning Protection, 1994.

Francisco Román Campos, Vernon Cooray and Vikor Scuka, *The Corona Onset Voltage as a Function of the Radius of Curvature of Floating Electrodes*, The Eleventh International Conference on Gas Discharges and Their Applications, Chuo University, Tokyo, 11–15 Sep. 1995.

Francisco Román Campos and Vikor Scuka, *The Influence of a Series Micro–Gap on the Breakdown Voltage Reduction of a Complex Gap Arrangement Containing Floating Electrodes, FE*, Ninth International Symposium of High Voltage Engineering, Aug. 28 –Sep. 1, 1995, Graz Convention Center, Austria, Europe.

Feldman, P.L., AA. P.J. and Thanh, L.C., *Present Status of Research–Cottrell Pulse Energization Technology*, EPRI Conference on Electrostatic Precipitators Technology for Coal–Fired Power Plants, Nashville, Tennessee, Jul. 1982.

Primary Examiner—Maura K. Regan
Attorney, Agent, or Firm—Jenkens & Gilchrist

[57] ABSTRACT

This invention relates to an electrostatic field measuring device which incorporates the phenomena of floating electrodes. The invention has no moving parts and is based on the use of the discharge frequency of floating electrodes as a measure of electric field intensity.

9 Claims, 4 Drawing Sheets

ELECTROSTATIC FIELD MEASURING DEVICE BASED ON PROPERTIES OF FLOATING ELECTRODES FOR DETECTING WHETHER LIGHTNING IS IMMINENT

BACKGROUND OF THE INVENTION

1. Field of the Invention

The present invention relates to a device which incorporates floating electrodes and is adapted to measure electrostatic fields. More particularly, the present invention relates to a device for measuring electrostatic fields, such as those present during thunderstorms. The preferred device incorporates the use of floating electrodes.

2. Description of Related Art

Electrostatic fields are measured in many industrial processes and are also measured in several types of research where DC voltages are applied or electrostatic fields are necessary. Presently, devices available for measuring electrostatic fields are rotating voltmeters or radioactive probes. These rotating voltmeters and radioactive probes are both expensive and require constant maintenance. Thus, what is needed is a relatively inexpensive device that is simple to use and requires little maintenance. The device should be able to measure electrostatic fields in industrial processes, the technology lab or during adverse weather conditions to help predict lightning strikes.

It is not unusual to have insulated conducting objects located close to the conductors of a lightning protection system. However, the separation of these objects from the lightning protection system could vary from a few millimeters to some centimeters. When the system is exposed to thunderstorm electric fields, discharge could be initiated between the lightning protection system and the floating conductive body. The critical field for the initiation of corona currents from a floating electrode, when a negative DC voltage is applied to the main gap electrodes, is detected by the discharge of the floating electrode to the earth electrode.

Several studies have examined the influence of a floating body on the breakdown voltage between a high voltage electrode and earth when the floating body is introduced between them. The reduction in the breakdown voltage and the increment in the time to breakdown caused by a floating electrode located approximately 1 mm from the earthed electrode have been investigated under the application of a negative impulse voltage in previous works. Furthermore, the reduction in the breakdown voltage caused by a floating body situated at about one-third of the gap distance from the earthed electrode was investigated by several authors under the application of a positive polarity impulse. The results were summarized in the CIGRE report of 1990. The influence of floating electrode corona sources on the observed reduction in the breakdown voltage of the complex gap was studied by Phillpott et al.

SUMMARY OF THE INVENTION

The present exemplary embodiments of the present invention incorporate the corona phenomena associated with a floating electrode located preferably 0.5, 1 or 2 mm from the earthed electrode that can contribute to the breakdown voltage across a predetermined gap. One of ordinary skill in the art would understand that the distance can be any distance ranging from a fraction of a millimeter to 10, 20 or even 30 millimeters depending on the electric field. This is achieved by the onset of corona currents of a 1.2 mm radius top of a floating electrode (see FIG. 2), when a negative DC field is applied. One of ordinary skill in the art would understand that the top of the floating electrode can have just about any radius ranging from a sharp point with virtually no radius to a sphere having a 5 mm radius or more. The shape and size of the floating electrode tip/top is a function of the electric field that is to be measured. The applied fields are in the order of magnitude of natural electrical fields present during thunderstorm conditions in the technology lab and for many industrial processes.

The electric field intensity at the high curvature (sharp) points on a floating electrode can be calculated numerically to determine the electric field in many cases. The floating electrode discharges to a grounded electrode repeatedly. The discharge repetition frequency is a function of the background electric field that the present invention may be located within.

BRIEF DESCRIPTION OF THE DRAWINGS

Various objects and advantages of this invention will become apparent and more readily appreciated from the following description taken in conjunction with the accompanying drawings, of which.

DETAILED DESCRIPTION OF THE EXEMPLARY EMBODIMENTS OF THE PRESENT INVENTION

Figure 1:
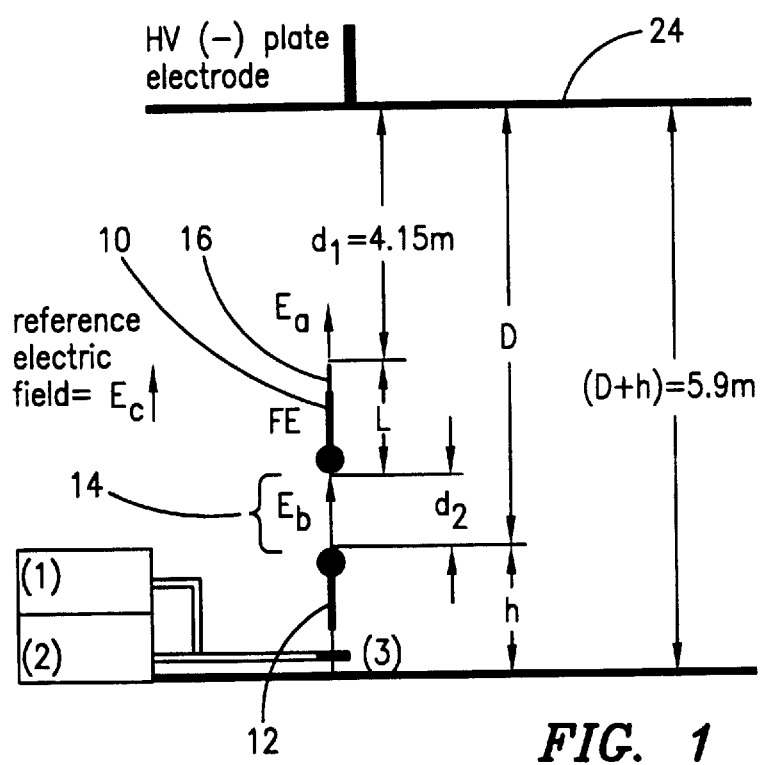
FIG. 1 depicts a first exemplary embodiment of the present electrostatic field measuring device.

As indicated in FIG. 1, a floating electrode 10 is an isolated metallic body located in the gap space of distance D at a certain distance from an earthed electrode 12. The convention used is to define this metallic body as a floating electrode (FE) 10 only when it is isolated. Three different electric fields are also shown in FIG. 1: $E_a$ and $E_b$ are the electric fields at the top of the floating electrode 10 and at the secondary gap 14, respectively. $E_c$ is a reference gap electric field, which is to be measured, obtained by dividing the applied negative DC voltage by the distance (D+h).

Figure 2:
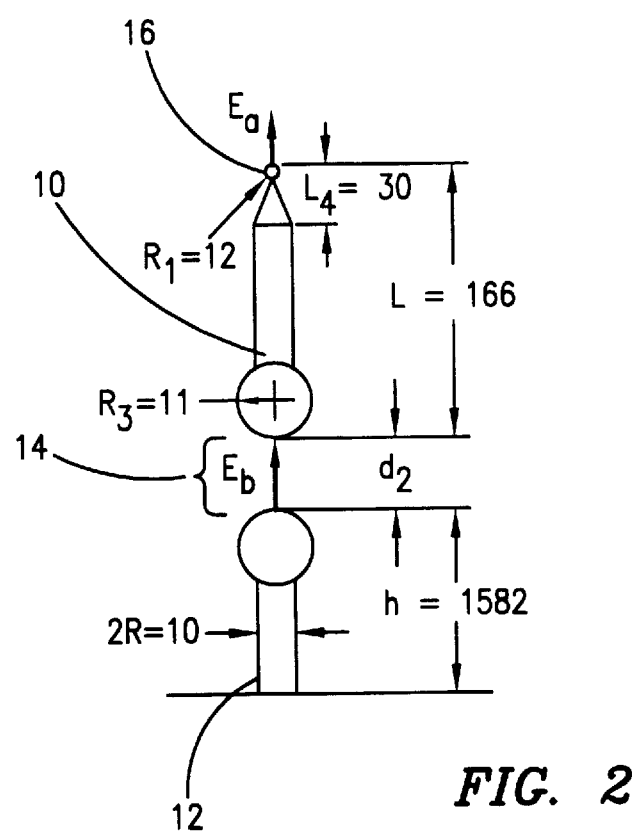
FIG. 2 depicts a second exemplary embodiment of the present electrostatic field measuring device.

The corona source 16 on the FE 10, activated by the reference electric field $E_c$, will cause charging of the FE 10 and consequently the breakdown of the secondary gap 14, see FIGS. 1 and 2. The electric field on the high curvature (sharp) points of the FE 10 surface at the instant of the breakdown on the secondary gap 14 is considered to be the critical field for the initiation of corona currents.

As shown in FIG. 1, the geometric parameters of an exemplary complex gap arrangement containing a floating electrode 10 and the measuring system. (Legend: FE 10 is the floating electrode: $d_1$ is the primary gap distance; $d_2$ is the secondary gap distance; D is the complex gap distance. $E_{da}$, $E_b$ are the electric fields at the top of the floating electrode and at the secondary gap, respectively. $E_c$ is the reference electric field which is to be measured. The measuring system can include: (1) frequency meter/counter 18; (2) analogue oscilloscope 20; and (3) Rogowsky coil 22. See FIG. 2 for other dimensions.)

FIG. 2 shows another exemplary embodiment wherein the floating electrode geometry and the electric fields $E_a$ at the top of the FE and $E_b$ at the secondary gap 14. The dimensions in mm are given in the figure; $d_2$=0.5, 1.0, 2.0 mm.

Some of the theory behind the present invention is as follows:

Floating electrodes 10 are metallic objects that are disconnected or isolated from the earth potential, and which, under certain well-defined conditions, can acquire a particular electric potential, thus accumulating a particular potential energy. The potential level and the amount of potential energy that the floating electrode 10 acquires is a direct function of its area and its location in the gap. It is a function of the FE capacitance. In an arrangement such as ours (see FIG. 1), the floating electrode can acquire a voltage which depends on the voltage distribution in the gap, the floating electrode's geometry and its location in the gap, and is strongly dependent on the secondary gap distance $d_2$ to the earthed electrode 12.

When a metallic body is inserted in the gap of length D, see FIG. 1, and a negative DC voltage is applied across the gap, the FE 10 distorts the electrostatic field (It is understood that a positive voltage can be applied across the gap in the exemplary embodiment as well). The electric field will be enhanced on the high curvature points of the FE 10 and the whole metallic body acquires a certain voltage with respect to earth, although its net charge is zero. If the acquired voltage of the floating electrode 10 is lower than the voltage that can be withstood across the secondary gap 14, no breakdown will occur, but if it is higher, the FE 10 will discharge to earth. The discharge brings the floating electrode 10 to earth potential, and it becomes charged. Thus, the net charge on the floating electrode becomes different from zero. In the present invention, the floating electrode 10 acquires a positive charge. This charge reduces the electric field strength in the secondary gap, but increases the electric field at the top of the floating electrode, see FIGS. 1 and 2. If the applied DC voltage across the gap remains constant, no further discharges will occur. With further increases in the applied DC voltage across the gap, the electric field $E_b$ in the secondary gap increases again, and when the breakdown electric field of the secondary gap is reached another discharge to earth takes place. Again, if the voltage remains constant, no further discharge takes place. With increasing DC voltage across the main gap, this process will lead to a gradual accumulation of positive charges on the floating body and to a gradual increase in the electric field at the top of the floating electrode 16 until the critical electric field for the initiation of corona currents is reached.

When the critical electric field is reached for the initiation of corona discharges on the high curvature protrusions of the FE 10, a corona discharge starts from the floating electrode 10. The floating electrode 10 acquires a charge of the opposite polarity to that of the corona source. That is, in the present embodiment, positive corona will charge the floating electrode 10 negatively.

The new acquisition of negative charges neutralizes the previously accumulated positive charges on the floating electrode 10, increasing the electric field at the secondary gap 14 and decreasing it at the top of the floating electrode 16. If the electric field at the secondary gap 14 exceeded the electric field strength there, a breakdown of the secondary gap 14 will soon occur. If not, it is probable that the accumulation of negative charges on the floating electrode 10 can decrease the electric field $E_a$ at the top of the floating electrode 16 and the corona discharge will be extinguished. This is a threshold situation where a small increase of the applied DC voltage to the gap can lead to a continuous repetitive charge-discharge process. This threshold or critical voltage $V_{crit}$ is a function of the secondary gap distance 14; higher secondary gap distances imply that the applied DC voltage must be higher. In this situation, the critical electric field for the initiation of corona currents will be slightly lower than the field at the top of the FE 10 necessary to initiate the repetitive charge and discharge process of the floating electrode 10.

It can then be concluded that if the electric field $E_a$ is equal to the critical electric field for the onset of corona currents, the FE 10 will be negatively charged, and if $E_b$ is equal to the secondary gap breakdown electric field, a sudden discharge will transfer this negative charge to earth. Once the discharge occurs, the FE 10 acquires a positive charge and a voltage that depends on the charge accumulated on the floating electrode. The corona sources on the FE can lead to a further increase of the secondary gap electric field $E_b$, and thereby initiate the charge-discharge process.

The duration of the charging process depends on the electric field intensity at the curved points of the FE surface. The duration can take several seconds for an electric field close to the corona onset, but it can be faster if the electric field is higher. The reason for this reduction in the charging time of the FE 10 is that the corona currents are enhanced by a higher electric field and the floating electrode capacitance will be charged faster. However, it must be noticed that the charge accumulation reduces the electric field on the high curvature points located at the top of the FE 10. If the field remaining after charging is higher or equal to the critical electric field, permanent secondary gap sparking occurs. The difference between two subsequent discharges is then a function of this remaining electric field. It can be concluded that this discharge repetition frequency (DRF) increases with applied electric field.

The upper limit for the DRF is when breakdown activity ceases and a permanent connecting channel bridges the secondary gap 14. Under this condition, the corona sources are capable of maintaining the thermalized secondary gap channel and a permanent connection between the FE 10 and the earth electrode 12 is established. Additionally, under this condition, the FE 10 is "earthed" by the discharge channel and no more secondary gap discharges are expected. This limit is a function of the secondary gap distance and decreases as the secondary gap decreases in size.

The potential acquired by the FE under the activation of corona sources is a direct function of the FE capacitance and the maximum electric field that the secondary gap can sustain. Thus, a well-defined amount of energy is stored in the FE 10. The maximum potential energy W stored in the gap can be calculated using $$W = \frac{1}{2} CV^2 \tag{1}$$

where C is the FE capacitance and V is the breakdown voltage of the secondary gap 14. Considering the secondary gap to be homogeneous, the voltage that can be sustained across it is a function of the breakdown electric field $E_b$ and is given by:

$$V = E_b d_2 \quad (2)$$

Combining Eqs. (1) and (2), the energy can be calculated from $$W = \frac{1}{2} C d_2^2 E_b^2 \quad (3)$$

As the capacitance C is inversely proportional to the secondary gap distance, it can be concluded that the potential energy stored in the gap is a direct function of the FE 10 area A, the permittivity $\epsilon$ of the insulating medium, the square of the breakdown electric field intensity of the secondary gap, i.e., $$E\frac{2}{b},$$

and the secondary gap distance, i.e.

$$W = (A, \epsilon, E_2^b, d_2) \quad (4)$$

In terms of the charge Q measured at the earthed electrode, the energy W is given by $$W = \frac{1}{2} Q d_2 E_b^2 \quad (5)$$

The concepts of FE capacitance, corona effect, secondary electric field, discharge repetition frequency (DRF) of the secondary gap and energy accumulated on the FE have been discussed. If a certain amount of potential energy is stored in the FE 10, the discharge process is only the transformation of this potential energy into a spark. The consequence is a rapid change of the charge accumulated on the surface of the FE 10. If this rate of change is high, a high current will be generated. The mean current $\bar{i}$, which is obtained, can be estimated:

$$\bar{i} = \frac{\Delta Q}{\Delta t} \quad (6)$$

where $\Delta t$ is directly related to the length of the discharge process, and $\Delta Q$ with the charge stored in the FE capacitance. For a small gap of 1 mm this is of the order of some nanoseconds and with a charge of the order of a few nanoCoulombs, the rate of change of charge is of the order of amperes. The increment of this current increase is a compromise between the capacitance of the FE 10 and the secondary gap electric field $E_b$: for small secondary gap distances, $\Delta t$ is very small, but the amount of charge $\Delta Q$ that can be stored is low because of the low breakdown voltage of small secondary gap distances.

The series gap can be incorporated into a sealed chamber. The sealed chamber can be filled with an electro-negative gas such as $SF_6$, pressurized air, nitrogen, etc, to either increase or decrease the breakdown voltage across the series gap.

The current that is drained to the earth in each discharge must be directly related to the corona current that charges the FE 10 between two subsequent discharges, as shown later.

If the floating electrode 10 has a low radius of curvature 16 (highly curved surface, e.g., a sharp point), the corona onset electric field will be reached with relatively low voltages being applied across the main gap.

A homogeneous negative DC electric field was generated in the arrangement shown in FIG. 1. The HV (high voltage) electrode 24 was a 100 m² electrode located 5.9 m above the earth, outside a high-voltage laboratory. A 300 KV DC source was used to generate the electrostatic field across the gap. With increasing voltage, the gap goes into breakdown. However, this breakdown process is not regular, but by further increasing the voltage the breakdown of the secondary gap becomes regular. The voltage reached in this stage was termed the critical voltage ($V_{crit}$). The current generated during the breakdown process of the secondary gap was measured by a Rogowsky coil (Pearson Electronics Inc. model 2877 with 2 ns rise time) connected to the analog storage Tektronix oscilloscope (model 7834, amplifier 7A19 with a fast measuring unit of rise time 0.9 ns). The discharge repetition frequency (DRF) of the breakdown impulses was measured with the frequency meter Data Precision model 5845, which is capable of measuring the average of a number of fast pulses produced in a time span of 10 s. During the experiment the atmospheric conditions were: pressure 995 HPa, temperature 4° C. and relative humidity of 30%. The current, and hence the charge released to ground in each discharge, was also measured.

Figure 3:
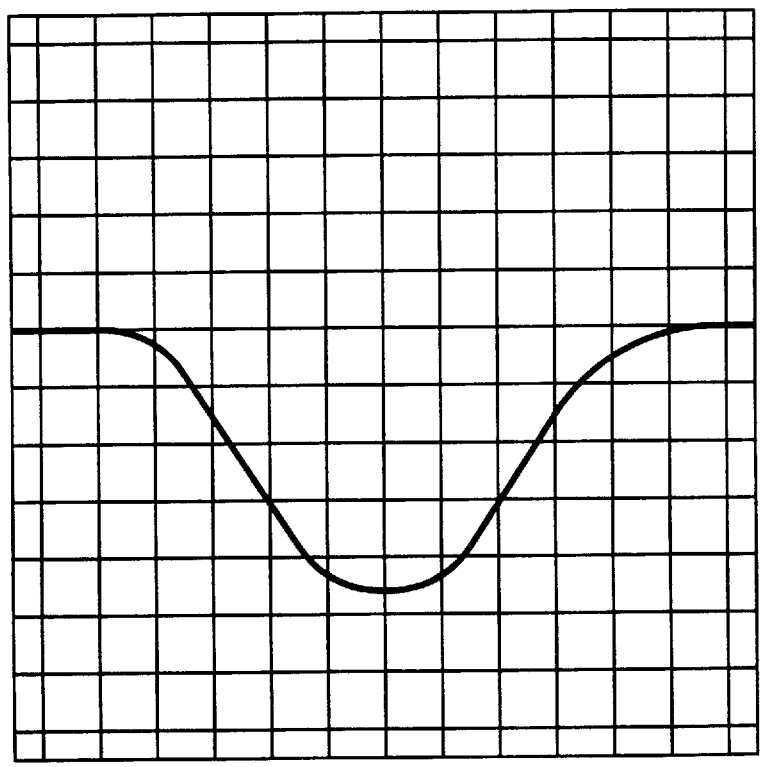
FIG. 3 depicts a graph indicating the current created by an exemplary embodiment as measured by a Rogowsky coil.

As mentioned before, the rise time for a secondary gap of 1 mm is of the order of a few nanoseconds. With the present measuring system it is not possible to measure the actual rise time of the discharge current impulses for gaps of the order of millimeters or fractions of millimeters. As a consequence, for small gaps, the current measured could be smaller than the actual current flowing during the secondary gap breakdown. A typical measured current waveform is shown in FIG. 3. The charge was obtained by integrating the measured current.

In the present exemplary embodiment the critical voltage necessary for the continuous discharging of the secondary gap increases with increasing secondary gap length. This is due to the fact that a longer secondary gap requires a larger voltage $V_{FE}$ across it to cause breakdown. This in turn requires a larger negative charge on the floating electrode. However, with increasing charge the electric field at the top of the floating electrode $E_a$ decreases. Therefore, in order to maintain the electric field at the top of the floating electrode 10 so that a continuous corona current is sustained, the voltage of the primary gap 14 should increase.

Second, note that the critical field $E_{ak}$ at the top of the floating electrode does not change significantly with the secondary gap length. This is due to the electric field at the top of the floating electrode being maintained at this critical electric field, which is independent of the secondary gap length, to maintain a continuous corona current. The electric field at the top of the floating electrode, $E_{earth}$, is also give in Table 1 when it is grounded (FE-earthed) and when the applied voltage is equal to $V_{crit}$. Note that this electric field increases with increasing secondary gap length. Since the critical electric field at the floating electrode for continuous corona is equal to $E_{ak}$ and as this is independent of the actual potential of the floating electrode, the above results show that the voltage across the complex gap necessary for corona initiation is less when the floating electrode is grounded.

TABLE 1

Summarized results at the critical condition

| Parameters ↓ | Secondary gap distances $d_2$ | | |
|---|---|---|---|
| | 0.5 | 1.0 | 2 |
| $V_{crit}$(kV) | 91.00 | 100.00 | 103.00 |
| $E_{ak}$(MV/m) | 7.00 | 7.80 | 8.40 |
| $E_{bk}$MV/m) | 4.70 | 4.80 | 3.40 |
| $E_{ck}$(kV/m) | 15.40 | 17.00 | 17.50 |

TABLE 1-continued

Summarized results at the critical condition

| Parameters ↓ | Secondary gap distances $d_2$ | | |
|---|---|---|---|
| | 0.5 | 1.0 | 2 |
| $E_{earth}$(MV/m) | 8.70 | 9.10 | 11.00 |
| $V_{FE}$(kV) | 2.40 | 4.80 | 5.20 |

Note: $d_2$, secondary gap distance in mm; $V_{crit}$, measured critical voltage of the main gap; $E_{aks}$ calculated critical electric field at the top of the FE just before sparking; $E_{ck}$, calculated critical reference electric field obtained by dividing the applied critical voltage $V_{crit}$ by the distance (D + h); $E_{earth}$, calculated electric field at the top of the FE for the critical voltage condition but with "FE-earthed" and $V_{FE}$, calculated voltage of the FE corresponding to the critical voltage of the main gap.

The amplitude of the measured current was a direct function of the secondary gap 14 distance as indicated in Table 2. Using Eqs. (1)–(6), the energy stored in the FE 10 was calculated. Other parameters involved in the discharge are also included in Table 2, e.g., the FE capacitance, the calculated voltage of the FE 10 corresponding to the critical voltage of the main gap, and the secondary gap electric field.

Figure 4:
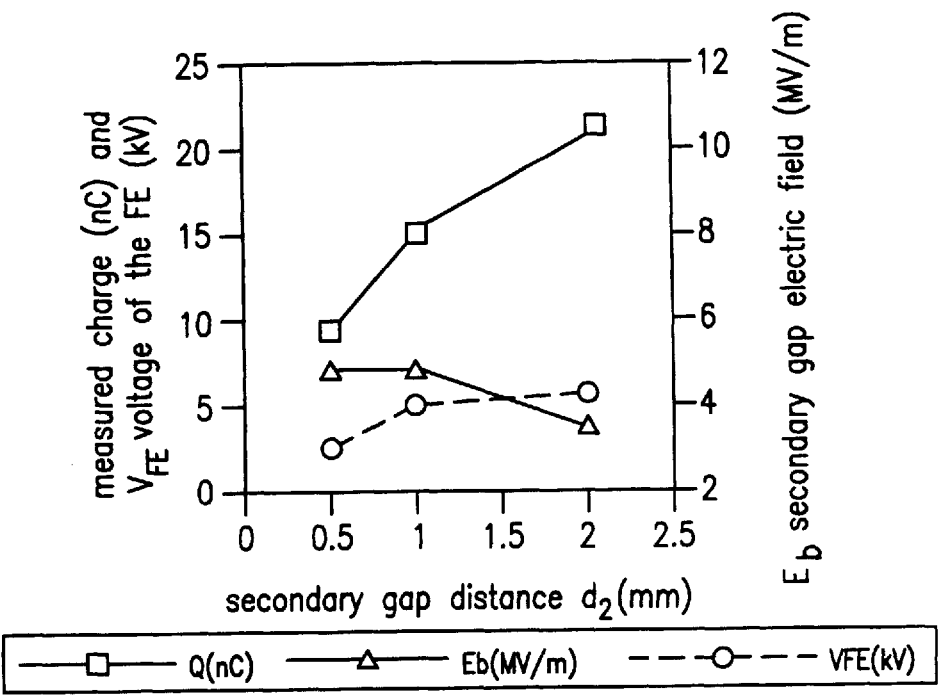
FIG. 4 depicts a graph indicating the charge calculated at the secondary gap of the floating electrode just before a spark crosses the secondary gap.

Note that the peak current i, the charge Q and the energy stored in the FE 10 increase with the secondary gap distance. This is explained by the fact that the floating electrode potential difference $V_{FE}$ across the secondary gap increases faster than the reduction in the capacitance. The charge Q is plotted in FIG. 4 as a function of the secondary gap distance. In the same figure the values of the FE voltage $V_{FE}$ and the electric field in the calculated secondary gap $E_b$ are also included. Note the increments of the FE charge and $V_{FE}$ as a function of the secondary gap distance and the inverted behavior of $E_b$.

The secondary gap discharge repetition frequency (DRF) as a function of the reference electric field $E_c$ was measured using the system described in FIGS. 1 and 2. The results of these measurements are plotted in FIG. 5. The behavior of a FE immersed in an homogeneous electric field can be derived from the curves in FIG. 5.

TABLE 2

Calculated and measured current related parameters

| Parameters ↓ | Secondary gap distances $d_2$ 14 | | |
|---|---|---|---|
| | 0.5 | 1.0 | 2 |
| i(A) | 3 | 3.2 | 4 |
| Q(nC) | 9 | 15 | 21 |
| C(pF) | 4.0 | 3.8 | 3.7 |
| $V_{FE}$(kV) | 2.4 | 4.8 | 5.2 |
| W(1) (μJ) | 11.5 | 44 | 50 |
| W(r) (μJ) | 10.6 | 36 | 71.4 |

Note: $d_2$, secondary gap distance in mm; i, measured current on the earthed electrode, Q, measured charge obtained by integrating the measured current; C, calculated capacitance of the FE; $Vz_{FE}$, calculated voltage of the FE corresponding to the critical voltage of the main gap; W(1), calculated energy stored in the FE using Eq. (1) and W(2); calculated energy stored in the FE using Eq. (5)

Figure 5:
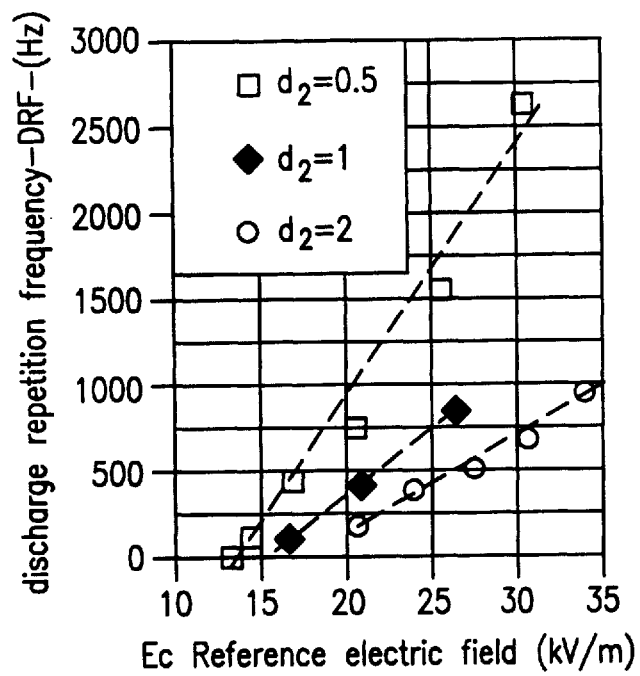
FIG. 5 depicts a graph indicating a relationship between an electric field and discharge repetition frequency.

First, FIG. 5 shows how, for a constant secondary gap distance and for constant increments in the reference electric field (i.e., the voltage applied across the main gap), the discharge repetition frequency (DRF) increases almost linearly. Secondary gap breakdown repetition frequency is shown as a function of the reference electric field. Note the increase in the repetition frequency with the reference electric field. The change in the slope with the secondary gap distance is remarkable. The best fitting curves are included. This is reasonable, because of the enhanced background electric field, the corona effect on the surface of the FE becomes enhanced and the duration of the charging process decreases. This shows that the corona current increases almost linearly with the background electric field. The mean value of the corona current $\bar{i}_c$ required to charge the FE capacitance, can be obtained from $$\bar{i}_c = Q \times DRF, \quad (7)$$

where Q is the measured charge from each FE discharge (see Table 2); DRF is the discharge repetition frequency in FIG. 5. The measured values of the critical reference electric field are in the order of magnitude of electrostatic fields present during thunderstorm conditions. For that reason the described sparking process on floating electrodes with similar shapes as indicated in FIGS. 1 and 2 can be activated under natural atmospheric conditions.

Second, for the same applied reference electric field, the DRF increases with a reduction in the secondary gap distance. This can be expected since the breakdown voltage reduces with the secondary gap distance $d_2$ for the range of secondary gap distances studied. If the breakdown voltage reduces, the amount of charge that can be stored without causing sparking in the FE reduces, and hence the sparking repetition frequency increases for short secondary gap distances.

Referring again to FIG. 2, the operation of this exemplary electrostatic field measuring device is based on the use of the discharge frequency of floating electrodes as a measure of the field intensity. The low radius of curvature sphere on the tip of a floating electrode which discharges is the corona source. The corona source charges the floating electrode which discharges, with a regular repetition frequency, to an earthed electrode. The discharge frequency is the measured variable that is linear function of the amplitude of the background electric field (see FIG. 5).

The present exemplary embodiments have the following advantages:

The principle of operation, stated above, of the present invention is very simple. There are no moving parts. Thus, a limited amount of maintenance is required. The present invention is simple to construct and would have a low production cost. And, most importantly the output, the discharge repetition frequency can be easily measured with a frequency meter.

The use of the present invention can be widely extended. It can be used to measured atmospheric electrostatic fields or DC fields. Different models can be developed for different applications: It can be used for high or only low precision electrostatic field measurements. It can also be extended to measure AC fields, where the frequency is also a function of the δE/δt or δV/δt. Note that when measuring AC fields the polarity will change directions.

As is clearly seen, the present invention is significant in the art of electrostatic field sensing. The present invention is believed to be especially effective when configured and employed as described herein, however, those skilled in the art will readily recognize that numerous variations and substitutions may be made in the invention and its use and configuration to achieve substantially the same results as achieved by the embodiments and, in particular, the preferred embodiment described herein. Each variation is intended to be included in the description herein and forms a part of the present invention. The foregoing detailed description is, thus, to be clearly understood as being given by way of illustration and example only, the spirit and scope of the present invention being limited solely by the appended claims.

What is claimed is:

1. An atmospheric electrostatic field measuring device for the indication of imminent lighting, comprising:
   a floating electrode disposed within an atmospheric electrostatic field;
   a grounded electrode separated from said floating electrode by a predetermined gap distance; and
   a measuring device connected to the grounded electrode for measuring the voltage amplitude of the atmospheric electrostatic field, said measuring device adapted to measure a discharge repetition frequency across the predetermined gap distance so as to provide an indication of the presence of imminent lightning.

2. The electrostatic field measuring device of claim 1, wherein said floating electrode comprises a corona source connected to a sphere such that said sphere is proximate to said grounded electrode.

3. The electrostatic field measuring device of claim 1, wherein said predetermined gap distance is greater than or equal to 1 mm.

4. The electrostatic field measuring device of claim 1, wherein said predetermined gap distance is a fraction of a millimeter.

5. The electrostatic field measuring device of claim 1, wherein said grounded electrode comprises a sphere located proximately to said floating electrode.

6. The electrostatic field measuring device of claim 1, wherein said floating electrode comprises a sphere on a top end of said floating electrode.

7. The electrostatic field measuring device of claim 1, wherein said measuring device counts a number of discharges between said floating electrode and said grounded electrode during a predetermined time period.

8. The electrostatic field measuring device of claim 1, wherein said floating electrode and said grounded electrode are encased in a sealed chamber.

9. The electrostatic field measuring device of claim 8, wherein said sealed chamber contains a gas.

* * * * *